(12) United States Patent
Okamoto et al.

(10) Patent No.: US 10,869,389 B2
(45) Date of Patent: Dec. 15, 2020

(54) PRINTED CIRCUIT BOARD AND METHOD FOR PRODUCING THE SAME

(71) Applicant: SUMITOMO ELECTRIC PRINTED CIRCUITS, INC., Koka (JP)

(72) Inventors: Kohei Okamoto, Koka (JP); Yoshihito Yamaguchi, Koka (JP); Kousuke Miura, Koka (JP); Hiroshi Ueda, Koka (JP); Atsushi Kimura, Koka (JP)

(73) Assignee: SUMITOMO ELECTRIC PRINTED CIRCUITS, INC., Koka (JP)

( * ) Notice: Subject to any disclaimer, the term of this patent is extended or adjusted under 35 U.S.C. 154(b) by 0 days.

(21) Appl. No.: 16/341,137

(22) PCT Filed: Oct. 5, 2017

(86) PCT No.: PCT/JP2017/036210
§ 371 (c)(1),
(2) Date: Apr. 11, 2019

(87) PCT Pub. No.: WO2018/070329
PCT Pub. Date: Apr. 19, 2018

(65) Prior Publication Data
US 2020/0045814 A1 Feb. 6, 2020

(30) Foreign Application Priority Data
Oct. 12, 2016 (JP) ................. 2016-201012

(51) Int. Cl.
*H05K 1/02* (2006.01)
*H05K 3/46* (2006.01)
(Continued)

(52) U.S. Cl.
CPC ........... *H05K 1/0298* (2013.01); *H01F 17/00* (2013.01); *H05K 1/0393* (2013.01); *H05K 1/118* (2013.01);
(Continued)

(58) Field of Classification Search
CPC ...... H05K 1/0298; H05K 3/4644; H05K 3/28; H05K 1/16; H01F 17/00
See application file for complete search history.

(56) References Cited

U.S. PATENT DOCUMENTS 7,851,706 B2 * 12/2010 Shin ..................... H05K 1/0218
174/254
8,835,773 B2 * 9/2014 Muramatsu ........... H01L 21/563
174/260
(Continued)

FOREIGN PATENT DOCUMENTS

JP S57-50410 A 3/1982
JP 2004-253684 A 9/2004
(Continued)

*Primary Examiner* — Ishwarbhai B Patel
(74) *Attorney, Agent, or Firm* — Faegre Drinker Biddle & Reath LLP

(57) ABSTRACT

A printed circuit board according to an embodiment of the present invention includes a base film having an insulating property, a conductive pattern that is stacked on at least one surface side of the base film and that includes a plurality of wiring portions arranged adjacent to one another, and an insulating layer that covers outer surfaces of the base film and the conductive pattern. The plurality of wiring portions have an average spacing of 1 μm or more and 20 μm or less and an average height of 30 μm or more and 120 μm or less. A filling area ratio of the insulating layer between the plurality of wiring portions adjacent to one another in sectional view is 95% or more.

7 Claims, 1 Drawing Sheet

(51) Int. Cl.
*H05K 3/28* (2006.01)
*H05K 1/11* (2006.01)
*H05K 3/06* (2006.01)
*H05K 1/03* (2006.01)
*H01F 17/00* (2006.01)

(52) U.S. Cl.
CPC ............... *H05K 3/06* (2013.01); *H05K 3/281* (2013.01); *H05K 3/4644* (2013.01); *H05K 2201/0141* (2013.01); *H05K 2201/0145* (2013.01); *H05K 2201/0154* (2013.01); *H05K 2203/066* (2013.01)

(56) References Cited

U.S. PATENT DOCUMENTS

| | | | |
|---|---|---|---|
| 2005/0174209 A1* | 8/2005 | Teshima | H01F 5/003 336/200 |
| 2007/0227768 A1* | 10/2007 | Shin | G11B 5/4846 174/262 |
| 2009/0107701 A1* | 4/2009 | Park | H01L 24/27 174/251 |
| 2016/0020163 A1* | 1/2016 | Shimizu | H01L 23/49822 361/768 |

FOREIGN PATENT DOCUMENTS

| | | |
|---|---|---|
| JP | 2007-53174 A | 3/2007 |
| JP | 2008-166391 A | 7/2008 |
| JP | 2013-4625 A | 1/2013 |
| JP | 2016-174142 A | 9/2016 |

\* cited by examiner

PRINTED CIRCUIT BOARD AND METHOD FOR PRODUCING THE SAME

TECHNICAL FIELD

The present invention relates to a printed circuit board and a method for producing the same.

The present application claims priority from Japanese Patent Application No. 2016-201012 filed on Oct. 12, 2016, and the entire contents of the Japanese patent application are incorporated herein by reference.

BACKGROUND ART

With reductions in the size and weight of electronic devices, printed circuit boards have been widely used. Such a printed circuit board typically has a structure in which conductive patterns are formed on a base film containing polyimide or the like as a main component, and the conductive patterns are covered with an insulating layer such as a solder resist (refer to Japanese Unexamined Patent Application Publication No. 2013-004625).

CITATION LIST

Patent Literature

PTL 1: Japanese Unexamined Patent Application Publication No. 2013-004625

SUMMARY OF INVENTION

A printed circuit board according to an embodiment of the present invention includes a base film having an insulating property, a conductive pattern that is stacked on at least one surface side of the base film and that includes a plurality of wiring portions arranged adjacent to one another, and an insulating layer that covers outer surfaces of the base film and the conductive pattern, in which the plurality of wiring portions have an average spacing of 1 μm or more and 20 μm or less and an average height of 30 μm or more and 120 μm or less, and a filling area ratio of the insulating layer between the plurality of wiring portions adjacent to one another in sectional view is 95% or more.

A method for producing a printed circuit board according to an embodiment of the present invention includes a stacking step of stacking, on at least one surface side of a base film having an insulating property, a conductive pattern that includes a plurality of wiring portions arranged adjacent to one another, a lamination step of laminating an insulating film on outer surfaces of the base film and the conductive pattern, and a vacuum hot-pressing step of vacuum hot-pressing a stacked body laminated with the insulating film, in which the plurality of wiring portions have an average spacing of 1 μm or more and 20 μm or less and an average height of 30 μm or more and 120 μm or less.

DESCRIPTION OF EMBODIMENTS

Figure 1:
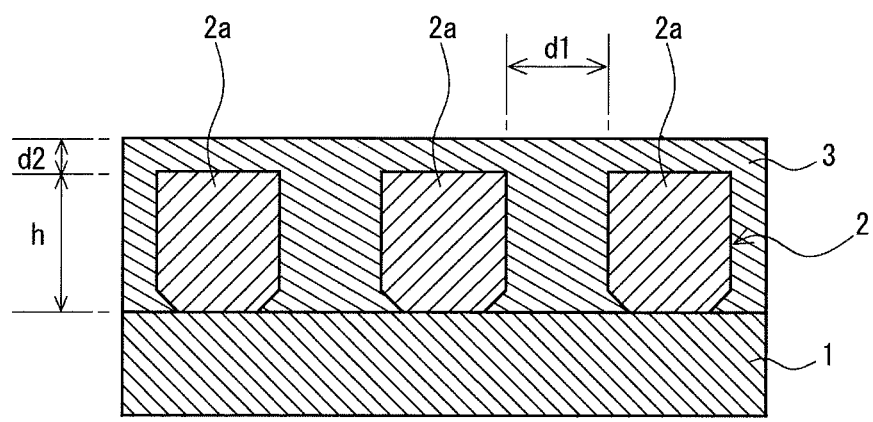
FIG. 1 is a schematic sectional view of a printed circuit board according to an embodiment of the present invention.

Problems to be Solved by Present Disclosure

In recent years, with a further reduction in the size of electronic devices, the wiring density of printed circuit boards has also been increasing. The increase in the wiring density makes the wiring spacing (pitch) extremely small. Accordingly, in the existing printed circuit board, regions between wiring lines, the regions not being filled with the insulating layer, may be generated in the vicinity of the surface of the base film, which may result in an insufficient insulating property between the wiring lines.

The present invention has been made in view of the circumstances described above. An object of the present invention is to provide a printed circuit board having a relatively high wiring density and having a good insulating property between wiring lines and a method for producing the printed circuit board.

Advantageous Effects of Present Disclosure

The printed circuit board and the method for producing the printed circuit board according to the present invention can improve both the wiring density and the insulating property between wiring lines.

Description of Embodiments of Present Invention

A printed circuit board according to an embodiment of the present invention includes a base film having an insulating property, a conductive pattern that is stacked on at least one surface side of the base film and that includes a plurality of wiring portions arranged adjacent to one another, and an insulating layer that covers outer surfaces of the base film and the conductive pattern, in which the plurality of wiring portions have an average spacing of 1 μm or more and 20 μm or less and an average height of 30 μm or more and 120 μm or less, and a filling area ratio of the insulating layer between the plurality of wiring portions adjacent to one another in sectional view is 95% or more.

The printed circuit board has an average spacing and an average height of wiring portions within the ranges described above and has a relatively high wiring density, whereas the printed circuit board has a filling area ratio of the insulating layer between the wiring portions of 95% or more and therefore also has a good insulating property. That is, the printed circuit board has a relatively high wiring density and a good insulating property between wiring lines.

An average minimum distance between an outer surface of each of the wiring portions and an outer surface of the insulating layer is preferably larger than 0 and 20 μm or less. When the average minimum distance between each of the wiring portions and the insulating layer is within the above range, the insulating property can be maintained without increasing the thickness of the insulating layer and by extension the thickness of the printed circuit board.

The insulating layer is preferably a solder resist. When a solder resist is used as the insulating layer, filling of the insulating layer can be easily and reliably performed in the filling area ratio described above.

A method for producing a printed circuit board according to another embodiment of the present invention includes a stacking step of stacking, on at least one surface side of a base film having an insulating property, a conductive pattern that includes a plurality of wiring portions arranged adjacent to one another, a lamination step of laminating an insulating film on outer surfaces of the base film and the conductive pattern, and a vacuum hot-pressing step of vacuum hot-pressing a stacked body laminated with the insulating film, in which the plurality of wiring portions have an average spacing of 1 μm or more and 20 μm or less and an average height of 30 μm or more and 120 μm or less.

According to the method for producing a printed circuit board, gaps between wiring portions having a relatively high wiring density can be easily and reliably filled with the insulating layer by vacuum hot-pressing after the insulating film is laminated on the outer surface of the conductive pattern. Accordingly, the method for producing a printed circuit board can provide a printed circuit board having a relatively high wiring density and a good insulating property.

In the vacuum hot-pressing step, a heating temperature is preferably 50° C. or higher and 150° C. or lower, and a pressing time is preferably 5 seconds or more and 20 seconds or less. When the pressing temperature and time in the vacuum hot-pressing are within the ranges described above, gaps between wiring portions can be easily and reliably filled with the insulating layer.

The term "filling area ratio" means, in a section perpendicular to a longitudinal direction of wiring portions, a ratio of an area filled with an insulating layer in a region located between side edges of wiring portions adjacent to one another in a direction parallel to a surface of a printed circuit board relative to the entire area of this region.

Details of Embodiments of Present Invention

Hereinafter, a printed circuit board and a method for producing the printed circuit board according to an embodiment of the present invention will be described in detail with reference to the drawings. Regarding the term "front and back" of the printed circuit board according to this embodiment, in the thickness direction of the printed circuit board, a side on which a conductive pattern is stacked is referred to as "front", while the other side opposite to the side on which the conductive pattern is stacked is referred to as "back", and these front and back do not mean the front and back of the printed circuit board with respect to the usage conditions of the printed circuit board.

[Printed Circuit Board]

A printed circuit board illustrated in FIG. 1 mainly includes a base film 1 having an insulating property, a conductive pattern 2 stacked on one surface side (the front surface side) of the base film 1, and an insulting layer 3 that covers outer surfaces of the base film 1 and the conductive pattern 2.

<Base Film>

The base film 1 is a layer made of a synthetic resin and having an electrically insulating property. The base film 1 also functions as a substrate on which the conductive pattern 2 is formed. The base film 1 may have flexibility, and in such a case, the printed circuit board is used as a flexible printed circuit board.

The material of the base film 1 is not particularly limited as long as the material has an insulating property. A synthetic resin film having a low dielectric constant and formed into a sheet-like shape can be used. Examples of a main component of the synthetic resin film include polyimide, polyethylene terephthalate, liquid crystal polymers, and fluororesins. The term "main component" refers to a component that has the highest content and, for example, a component having a content of 50% by mass or more in the material.

The lower limit of an average thickness of the base film 1 is preferably 5 μm and more preferably 10 μm. The upper limit of the average thickness of the base film 1 is preferably 50 μm and more preferably 40 μm. When the average thickness of the base film 1 is less than the lower limit, the base film 1 may have an insufficient insulating strength. When the average thickness of the base film 1 exceeds the upper limit, the thickness of the printed circuit board may increase unnecessarily.

<Conductive Pattern>

The conductive pattern 2 is a layer made of a material having conductivity and includes a plurality of wiring portions 2a arranged adjacent to one another. The wiring portions 2 are, for example, wiring lines that form a coil pattern. The conductive pattern 2 may include a pattern other than the wiring portions 2a, for example, a pattern of land portions or the like. The conductive pattern 2 may be stacked on a surface of the base film 1 either directly or with an adhesive layer therebetween.

The material (main component) of the conductive pattern 2 is not particularly limited as long as the material has conductivity. This material preferably has a low electrical resistance. The conductive pattern 2 can be formed of, for example, copper or silver. The conductive pattern 2 may be plated with, for example, gold, silver, tin, or nickel.

The lower limit of an average spacing d1 of the plurality of wiring portions 2a is 1 μm, more preferably 3 μm, and still more preferably 5 μm. On the other hand, the upper limit of the average spacing d1 of the plurality of wiring portions 2a is 20 μm, more preferably 15 μm, and still more preferably 10 μm. When the average spacing d1 of the plurality of wiring portions 2a is smaller than the lower limit, short-circuit may occur between the wiring portions 2a. In contrast, when the average spacing d1 of the plurality of wiring portions 2a exceeds the upper limit, requirements for the wiring density may not be satisfied. In addition, gaps between the wiring portions 2a can also be easily filled with an insulating layer by an existing method, and thus the advantageous effects of the present invention may not be sufficiently achieved. The term "average spacing of a plurality of wiring portions" refers to a value determined by averaging, in the longitudinal direction of wiring portions, the minimum distance between facing side edges of wiring portions adjacent one another in a section perpendicular to the longitudinal direction of the wiring portions.

The lower limit of an average height h of the plurality of wiring portions 2a is 30 μm, more preferably 35 μm, and still more preferably 40 μm. On the other hand, the upper limit of the average height h of the plurality of wiring portions 2a is 120 μm, more preferably 100 μm, and still more preferably 80 μm. When the average height h of the plurality of wiring portions 2a is smaller than the lower limit, with an increase in the wiring density, the wiring portions 2a may have an excessively high resistance. In addition, gaps between the wiring portions 2a can also be easily filled with an insulating layer by an existing method, and thus the advantageous effects of the present invention may not be sufficiently achieved. In contrast, when the average height h of the plurality of wiring portions 2a exceeds the upper limit, the thickness of the printed circuit board may increase unnecessarily. The term "average height of a plurality of wiring portions" refers to a value determined by averaging, in the longitudinal direction of wiring portions, the maximum height of each of the wiring portions in a section perpendicular to the longitudinal direction of the wiring portions.

The lower limit of an average width of the plurality of wiring portions 2a is preferably 10 more preferably 15 μm, and still more preferably 20 µm. On the other hand, the upper limit of the average width of the plurality of wiring portions 2a is preferably 40 more preferably 35 µm, and still more preferably 30 µm. When the average width of the plurality of wiring portions 2a is smaller than the lower limit, a difficulty in the production may occur. In contrast, when the average width of the plurality of wiring portions 2a exceeds the upper limit, requirements for the wiring density may not be satisfied. The term "average width of a plurality of wiring portions" refers to a value determined by averaging, in the longitudinal direction of wiring portions, the width of a bottom surface of each of the wiring portions (an interface with the base film) in a section perpendicular to the longitudinal direction of the wiring portions.

The lower limit of an average aspect ratio of the plurality of wiring portions 2a is preferably 1.2, more preferably 1.4, and still more preferably 1.6. On the other hand, the upper limit of the average aspect ratio of the plurality of wiring portions 2a is preferably 5.0, more preferably 4.0, and still more preferably 3.0. When the average aspect ratio of the plurality of wiring portions 2a is lower than the lower limit, requirements for the wiring density may not be satisfied. In contrast, when the average aspect ratio of the plurality of wiring portions 2a exceeds the upper limit, a difficulty in the production may occur. The term "aspect ratio of a plurality of wiring portions" refers to a ratio of the average height h to the average width.

The lower limit of a ratio (h/d1) of the average height h to the average spacing d1 of the plurality of wiring portions 2a is preferably 2.0, more preferably 3.0, and still more preferably 4.0. On the other hand, the upper limit of the ratio (h/d1) is preferably 12.0, more preferably 10.0, and still more preferably 8.0. When the ratio (h/d1) is lower than the lower limit, requirements for the wiring density may not be satisfied. In contrast, when the ratio (h/d1) exceeds the upper limit, the thickness of the printed circuit board may increase unnecessarily.

In the wiring portions 2a that form a coil pattern, the sectional areas (the average widths, the average heights, and the average aspect ratios) of the plurality of wiring portions 2a are preferably equal to each other.

As illustrated in FIG. 1, each of the wiring portions 2a has, on a bottom surface portion on the base film 1 side, a tapered portion in which the width gradually decreases toward the base film 1. This tapered portion is formed by secondary plating when the wiring portions 2a are formed by further performing secondary plating on a pattern formed by a semi-additive method. In such wiring portions 2a, in particular, the tapered portions are unlikely to be filled with an insulating layer, and voids are easily formed in the tapered portions.

<Insulating Layer>

The insulating layer 3 is a layer that mainly protects the conductive pattern 2 in the printed circuit board. The material of the insulating layer 3 is not particularly limited as long as the material has an insulating property. Examples of the material that can be used include materials that contain, as a main component, a resin such as polyimide, an epoxy resin, a phenolic resin, an acrylic resin, polyester, thermoplastic polyimide, polyethylene terephthalate, a fluororesin, or a liquid-crystal polymer. Of these, thermoplastic resins are preferred. In particular, the use of a solder resist as the insulating layer 3 enables the insulating layer 3 to be easily formed by a production method described below. Furthermore, the insulating layer 3 is preferably formed by laminating a resin film.

The lower limit of a melting point or a glass transition point when the melting point is not present (hereinafter, also referred to as "a melting point or a glass transition point T") of the resin serving as the main component of the insulating layer 3 is preferably 30° C., more preferably 40° C., and still more preferably 50° C. On the other hand, the upper limit of the melting point or the glass transition point T is preferably 200° C., more preferably 190° C., and still more preferably 180° C. When the melting point or the glass transition point T is lower than the lower limit, the insulating layer 3 may have insufficient heat resistance. On the other hand, when the melting point or the glass transition point T exceeds the upper limit, it may become difficult to achieve a filling area ratio described below. The term "melting point" means a melting point peak measured by a differential scanning calorimeter (DSC) in accordance with JIS-K-7121 (2012). The term "glass transition point" means a midpoint glass transition temperature measured by a differential scanning calorimeter (DSC) in accordance with JIS-K-7121 (2012).

The lower limit of the filling area ratio of the insulating layer 3 between a plurality of wiring portions 2a adjacent to one another in sectional view is 95%, more preferably 98%, and still more preferably 99%. Furthermore, the filling area ratio is preferably 100%, that is, substantially no voids (air bubbles) are present between the insulating layer 3 and the base film 1.

The lower limit of an average thickness of the insulating layer 3 (an average distance from the front surface of the base film 1 to the outer surface of the insulating layer 3) is preferably 40 µm, more preferably 50 µm, and still more preferably 60 µm. On the other hand, the upper limit of the average thickness of the insulating layer 3 is preferably 90 µm, more preferably 80 µm, and still more preferably 70 µm. When the average thickness of the insulating layer 3 is smaller than the lower limit, the insulating property may become insufficient. In contrast, when the average thickness of the insulating layer 3 exceeds the upper limit, the thickness of the printed circuit board may increase unnecessarily.

An average minimum distance d2 between the outer surface of each of the wiring portion 2a and the outer surface of the insulating layer 3 is larger than 0. The lower limit of the average minimum distance d2 is preferably 0.1 µm, more preferably 0.5 µm, and still more preferably 1 µm. On the other hand, the upper limit of the average minimum distance d2 is preferably 20 µm, more preferably 15 µm, and still more preferably 10 When the average minimum distance d2 is smaller than the lower limit, the insulating property may become insufficient. In contrast, when the average minimum distance d2 exceeds the upper limit, the thickness of the printed circuit board may increase unnecessarily. That is, when the average minimum distance d2 in the printed circuit board is within the above range, the thickness of the entire printed circuit board can be reduced while maintaining the insulating property due to the insulating layer 3. The term "average minimum distance between the outer surface of each of wiring portions and the outer surface of an insulating layer" refers to a value determined by averaging, in the longitudinal direction of wiring portions, the minimum distance between the outer surface of the insulating layer and a surface of each of the wiring portions, the surface being on the opposite side of the base film.

[Method for Producing Printed Circuit Board]

Figure 2:
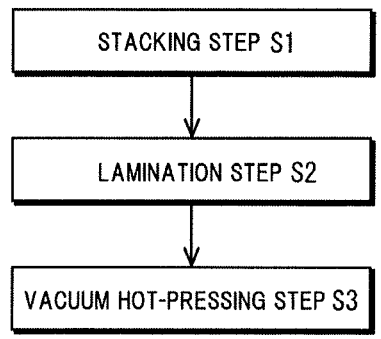
FIG. 2 is a flowchart illustrating a method for producing a printed circuit board according to an embodiment of the present invention.

A method for producing the printed circuit board mainly includes, as illustrated in FIG. 2, a stacking step S1 of stacking, on at least one surface side of a base film having an insulating property, a conductive pattern including a plurality of wiring portions arranged adjacent to one another; a lamination step S2 of laminating an insulating film on outer surfaces of the base film and the conductive pattern; and a vacuum hot-pressing step S3 of vacuum hot-pressing a stacked body laminated with the insulating film.

<Stacking Step>

In the stacking step S1, a conductive pattern including a plurality of wiring portions arranged adjacent to one another is stacked on at least one surface side of a base film. A known method can be used as the method for stacking the conductive pattern. A subtractive method, a semi-additive method, or the like can be used. In particular, a conductive pattern having a high wiring density can be efficiently obtained by using the semi-additive method.

<Lamination Step>

In the lamination step S2, an insulating film that forms an insulating layer is laminated on an outer surface of a stacked body obtained in the stacking step S1 and including the base film and the conductive pattern. A main component of this insulating film can be the same as the main component of the insulating layer of the printed circuit board. This insulating film preferably has flexibility.

An average thickness of the insulating film is appropriately designed in accordance with the thickness of the conductive pattern and the thickness of the insulating layer to be formed. The lower limit of the average thickness is preferably 30 μm and more preferably 40 μm.

On the other hand, the upper limit of the average thickness of the insulating film is preferably 80 μm and more preferably 60 μm.

<Vacuum Hot-Pressing Step>

In the vacuum hot-pressing step S3, the resulting product which is obtained in the lamination step S2 by laminating the insulating film on the stacked body including the base film and the conductive pattern is vacuum hot-pressed. This vacuum hot-pressing can be performed by a known pressing machine. The vacuum hot-pressing is performed for the continuous sheet-like stacked body in a batch manner.

The lower limit of a heating temperature in the vacuum hot-pressing is preferably 50° C., more preferably 60° C., and still more preferably 70° C. On the other hand, the upper limit of the heating temperature is preferably 150° C., more preferably 130° C., and still more preferably 110° C.

The lower limit of a heating time in the vacuum hot-pressing is preferably 5 seconds and more preferably 8 seconds. On the other hand, the upper limit of the heating time is preferably 20 seconds and more preferably 15 seconds.

When the heating temperature or heating time is smaller than the lower limit, gaps between the wiring portions are not sufficiently filled with the insulating layer, which may result in a decrease in the insulating property. In contrast, when the heating temperature or the heating time exceeds the upper limit, for example, the base film may be deformed or degraded.

The lower limit of a pressing pressure in the vacuum hot-pressing is preferably 0.3 MPa, more preferably 0.4 MPa, and still more preferably 0.5 MPa. On the other hand, the upper limit of the pressing pressure is preferably 1.3 MPa, more preferably 1.2 MPa, and still more preferably 1.1 MPa. When the pressing pressure is lower than the lower limit, gaps between the wiring portions are not sufficiently filled with the insulating layer, which may result in a decrease in the insulating property. In contrast, when the pressing pressure exceeds the upper limit, for example, the base film may be deformed or broken.

After the vacuum hot-pressing step S3, a step of forming an opening for electrical connection in the insulating layer may be performed. When a dry film of a solder resist is used as the insulating film, the opening can be easily formed by steps of, for example, exposure and development.

<Advantages>

The printed circuit board has an average spacing and an average height of wiring portions within the ranges described above and has a relatively high wiring density, whereas the printed circuit board has a filling area ratio of the insulating layer between the wiring portions of 95% or more and therefore also has a good insulating property. That is, the printed circuit board has a relatively high wiring density and a good insulating property between wiring lines.

In addition, the method for producing a printed circuit board can relatively easily provide such a printed circuit board compared with the case where an insulating layer is formed by applying an insulating ink.

Since the wiring density can be enhanced in the printed circuit board, the printed circuit board can be suitably used as an actuator, an antenna, a transformer, or the like for compact devices.

Other Embodiments

It is to be understood that the embodiments disclosed herein are only illustrative and non-restrictive in all respects. The scope of the present invention is not limited to the configurations of the embodiments and is defined by the claims described below. The scope of the present invention is intended to cover all the modifications within the meaning and the scope of equivalents of the claims.

In the embodiments described above, a description has been made of a printed circuit board that includes a single base film and a single-layer conductive pattern stacked on one of surfaces of the base film. A printed circuit board in which a conductive pattern is stacked on each of the surfaces of a single base film is also within the intended scope of the present invention. Furthermore, the printed circuit board may be a multilayer printed circuit board including a plurality of base films, each of which has a conductive pattern on one or both surfaces thereof.

The insulating layer of the printed circuit board may be formed by applying and drying a resin composition (insulating ink).

REFERENCE SIGNS LIST 1 base film
2 conductive pattern
2a wiring portion
3 insulating layer
S1 stacking step
S2 lamination step
S3 vacuum hot-pressing step

The invention claimed is:

1. A printed circuit board comprising:
a base film having an insulating property;
a conductive pattern that is stacked on at least one surface side of the base film and that includes a plurality of wiring portions arranged adjacent to one another, wherein each of the wiring portions has, on a bottom surface on a base film side, a tapered portion in which a width of the wiring portion gradually decreases toward the base film; and
an insulating layer that covers outer surfaces of the base film and the conductive pattern, wherein the plurality of wiring portions have an average spacing of 1 μm to 20 μm and an average height of 30 μm to 120 μm, wherein a ratio of the average height of the plurality of wiring portions to the average spacing of adjacent wiring portions of the plurality of wiring portions is 2.0 to 12.0, and wherein a filling area ratio of the insulating layer between the plurality of wiring portions adjacent to one another in sectional view is 95% or more.

2. The printed circuit board according to claim 1, wherein an average minimum distance between an outer surface of each of the wiring portions and an outer surface of the insulating layer is between larger than 0 μm to and including 20 μm.

3. The printed circuit board according to claim 1, wherein the insulating layer is a solder resist.

4. The printed circuit board according to claim 1, wherein the ratio of the average height of the plurality of wiring portions to the average spacing of adjacent wiring portions of the plurality of wiring portions is 3.0 to 12.0.

5. The printed circuit board according to claim 1, wherein the ratio of the average height of the plurality of wiring portions to the average spacing of adjacent wiring portions of the plurality of wiring portions is 4.0 to 12.0.

6. A method for producing a printed circuit board, comprising: a stacking step of stacking, on at least one surface side of a base film having an insulating property, a conductive pattern that includes a plurality of wiring portions arranged adjacent to one another, wherein each of the wiring portions has, on a bottom surface on a base film side, a tapered portion in which a width of the wiring portion gradually decreases toward the base film; a lamination step of laminating an insulating film on outer surfaces of the base film and the conductive pattern; and a vacuum hot-pressing step of vacuum hot-pressing a stacked body laminated with the insulating film, wherein the plurality of wiring portions have an average spacing of 1 μm to 20 μm and an average height of 30 μm to 120 μm, and wherein a ratio of the average height of the plurality of wiring portions to the average spacing of adjacent wiring portions of the plurality of wiring portions is 2.0 to 12.0, and wherein a filling area ratio of the insulating layer between the plurality of wiring portions adjacent to one another in sectional view is 95% or more.

7. The method for producing a printed circuit board according to claim 6, wherein in the vacuum hot-pressing step, a heating temperature is 50° C. to 150° C., and a pressing time is 5 seconds to 20 seconds.

* * * * *